United States Patent
Morizuka

(12) 
(10) Patent No.: US 6,689,652 B2
(45) Date of Patent: Feb. 10, 2004

(54) METHOD OF MANUFACTURING A HIGH ELECTRON MOBILITY TRANSISTOR

(75) Inventor: Mayumi Morizuka, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/375,084

(22) Filed: Feb. 28, 2003

(65) Prior Publication Data

US 2003/0162339 A1 Aug. 28, 2003

Related U.S. Application Data

(63) Continuation of application No. 09/778,823, filed on Feb. 8, 2001, now Pat. No. 6,555,851.

(30) Foreign Application Priority Data

Mar. 30, 2000 (JP) ........................................ 2000-094574

(51) Int. Cl.[7] .......................................... H01L 21/338
(52) U.S. Cl. ........................................................ 438/172
(58) Field of Search ................................ 438/172, 586, 438/FOR 198; 257/29.246

(56) References Cited

U.S. PATENT DOCUMENTS

| | | | |
|---|---|---|---|
| 4,709,251 A | | 11/1987 | Suzuki |
| 4,807,001 A | * | 2/1989 | Hida .......................... 257/192 |
| 5,223,724 A | * | 6/1993 | Green, Jr. .................. 257/194 |
| 5,412,224 A | * | 5/1995 | Goronkin et al. ............. 257/15 |
| 5,436,474 A | * | 7/1995 | Banerjee et al. ............ 257/194 |
| 5,689,124 A | * | 11/1997 | Morikawa et al. .......... 257/192 |
| 5,693,963 A | | 12/1997 | Fujimoto et al. |
| 5,701,016 A | * | 12/1997 | Burroughes et al. .......... 257/24 |
| 6,033,976 A | | 3/2000 | Murakami et al. |
| 6,100,549 A | | 8/2000 | Weitzel et al. |
| 6,177,685 B1 | | 1/2001 | Teraguchi et al. |
| 6,207,976 B1 | | 3/2001 | Takahashi et al. |
| 6,429,032 B1 | | 8/2002 | Okuyama et al. |
| 2001/0015437 A1 | | 8/2001 | Ishii et al. |
| 2001/0020700 A1 | | 9/2001 | Inoue et al. |
| 2001/0023964 A1 | | 9/2001 | Wu et al. |
| 2003/0034520 A1 | * | 2/2003 | Kusunoki ................... 257/344 |

OTHER PUBLICATIONS

K. Fujimoto et al., Sidegating Effect of GaAs MESFETs in Carbon Doped GaAs Substrate; Electronics Letters; vol. 29, No. 12, Jun. 10, 1993; pp., 1080–1081.

M. R. Wilson et al., "Understanding the Cause of IV Kink in GaAs MESFET's with Two–Dimensional Numerical Simulations," GaAs IC Symposium, 1995, pp., 109–112.

* cited by examiner

*Primary Examiner*—George Fourson
(74) *Attorney, Agent, or Firm*—Oblon, Spivak, McClelland, Maier & Neustadt, P.C.

(57) ABSTRACT

A method of manufacturing a high electron mobility transistor, comprising laminating an electron accumulation layer and an electron supply layer successively on a substrate; selectively removing the electron supply layer to isolate an element region; forming a source and a drain electrode on the electron supply layer of the isolated element region; and forming a hole absorption electrode on the electron accumulation layer exposed by the selective removal of the electron supply layer, and simultaneously forming a gate electrode on the electron supply layer of the isolated element region.

5 Claims, 3 Drawing Sheets

METHOD OF MANUFACTURING A HIGH ELECTRON MOBILITY TRANSISTOR

CROSS-REFERENCE TO RELATED APPLICATIONS

This Application is a divisional of and claims the benefit of the earlier filing date of allowed U.S. patent application Ser. No. 09/778,823, filed Feb. 8, 2001, now U.S. Pat. No. 6,555,851, which claims the benefit of priority from the prior Japanese Patent Application No. 2000-094574, filed Mar. 30, 2000, the entire contents of each are incorporated herein by reference.

BACKGROUND OF THE INVENTION

The present invention relates to a high electron mobility transistor (HEMT), more particularly to a GaN-based HEMT.

It is strongly expected that a nitrogen-compound field-effect transistor using GaN serves as a power element to be operated at a high power and at a high frequency. The nitrogen-compound field-effect transistors which have been proposed are a Schottky gate field-effect transistor, MESFET (metal semiconductor field-effect transistor), HEMT or MODFET (modulated doped field-effect transistor), and MISFET (metal insulator semiconductor field-effect transistor). Of them, a GaN-based HEMT employing $Al_xGa_{(1-x)}N$ as an electron supply layer is considered as a promising high power element since an electron concentration can be rendered higher than that of the GaAs-based HEMT. However, a conventional GaN-based HEMT has a problem in that a kink phenomenon sometimes occurs in the drain-current/voltage characteristics. If the kink phenomenon occurs, a power-added efficiency decreases in a large signal operation performed at a high frequency. The power-added efficiency η is defined as η=(Pout−Pin)/VdId, wherein Pout is an output power, Pin is an input power, Vd is a supply voltage and Id is a drain current. In addition, the distortion increases and the linearity deteriorates.

Now, the reason why the kink phenomenon occurs in the GaN-based HEMT will be explained. FIG. 1 is a schematic cross-sectional view of the GaN-based HEMT according to a first conventional example. In FIG. 1, reference numerals 11, 12, 13, 14, and 15 denote a GaN electron accumulation layer, $Al_xGa_{(1-x)}N$ spacer layer, n-type $Al_xGa_{(1-x)}N$ electron supply layer, $Al_xGa_{(1-x)}N$ cap layer, and a sapphire substrate, respectively. Furthermore, a gate electrode 16 is formed on the cap layer 14, while a source electrode 17 and a drain electrode 18 are formed on the electron supply layer 13.

In the GaN-based HEMT according to the first conventional example, when a drain voltage increases to raise the intensity of the electric field within the electron accumulation layer 11, a current of electrons flows through a strong electric field region between the source electrode 17 and the drain electrode 18. As a result, pairs 22 of electrons and holes are generated by impact ionization within the electron accumulation layer 11. The electrons thus generated flow into the drain electrode 18, increasing the drain current a little. However, the effect of the increased drain current is small. On the other hand, the generated holes 23 are accumulated in a lower portion of the electron accumulating layer 11 as shown in the figure, due to the absence of the electrode for absorbing the holes. The potential of the electron accumulation layer therefore decreases, with the result that the drain current substantially increases in a drain-current saturation region of a graph showing the drain current/voltage characteristics. The drain current significantly increased in this way causes the kink phenomenon shown in FIG. 2.

FIG. 3 is a schematic cross-sectional view of a GaAs-based HEMT according to a second conventional example. Reference numerals 11', 12', 13', 14', and 15' of FIG. 3 are a GaAs electron accumulation layer, $Al_xGa_{(1-x)}As$ spacer layer, n-type $Al_xGa_{(1-x)}As$ electron supply layer, $Al_xGa_{(1-x)}As$ cap layer, and GaAs substrate, respectively. Furthermore, a gate electrode 16' is formed on the cap layer 14', while a source electrode 17' and a drain electrode 18' are formed on the electron supply layer 13'.

In the GaAs-based HEMT according to the second conventional example pairs 22 of electrons and holes are also generated in the electron accumulation layer 11' by the impact ionization as described in the first conventional example. However, most of the holes are absorbed by the gate electrode as shown in FIG. 3. Therefore, the holes are not accumulated in the electron accumulation layer 11'. As a result, the kink phenomenon, a problem of the GaN-based HEMT of the first conventional example, does not occur in the GaAs-based HEMT in the second conventional example.

The big difference of the GaN-based HEMT of the first conventional example from the GaAs-based HEMT of the second conventional example resides in that a large amount of piezoelectric polarization charges 21 are generated in a hetero-junction interface in the former GaN-based HEMT. This is because the ratio between GaN and $Al_xGa_{(1-x)}N$ in lattice constant is larger than that between GaAs and $Al_xGa_{(1-x)}As$ by an order of magnitude.

When the hetero junction of the GaN layer and the AlGaN layer is formed, positive charges are accumulated in the AlGaN layer near the interface at a GaN-layer side, whereas negative charges are accumulated in the AlGaN layer near the interface at a gate-electrode side due to the piezoelectric polarization effect. As a result, most of the holes generated by the impact ionization are prevented from flowing into the gate electrode by the piezoelectric polarization charges (positive charges) accumulated in the AlGaN layer near the interface at the GaN layer side. The holes are therefore accumulated in the GaN electron accumulation layer, causing the kink phenomenon.

BRIEF SUMMARY OF THE INVENTION

An object of the present invention is to provide a compound-semiconductor-based high electron mobility transistor while preventing a kink phenomenon.

To attain the aforementioned object, the first aspect of the present invention provides a high electron mobility transistor comprising:

a GaN-based electron accumulation layer formed on a substrate;

an electron supply layer formed on the electron accumulation layer;

a source electrode and a drain electrode formed on the electron supply layer and spaced from each other;

a gate electrode formed on the electron supply layer between the source and the drain electrode; and a hole absorption electrode formed on the electron accumulation layer so as to be substantially spaced from the electron supply layer.

According to a second aspect of the present invention, there is provided a high electron mobility transistor comprising:

an electron accumulation layer formed on a substrate;

an electron supply layer formed on the electron accumulation layer, for generating a piezoelectric polarization charge of $1\times10^{-7}$ C/cm$^2$ or more between the electron accumulating layer and the electron supply layer;

a source electrode and a drain electrode formed on the electron supply layer and spaced from each other;

a gate electrode formed on the electron supply layer between the source and the drain electrode; and a hole absorption electrode formed on the electron accumulation layer so as to be substantially spaced from the electron supply layer.

In the high electron mobility transistor, the hole absorption electrode, which is substantially isolated from the electron supply layer, may be formed spaced apart from the electron supply layer in such a manner that the hole absorption electrode is not electrically affected by the electron supply layer. However, it is preferable that the hole absorption electrode is completely isolated from the electron supply layer.

The high electron mobility transistor is preferably constituted as follows.

(1) The hole absorption electrode is formed on the electron accumulation layer via a semiconductor layer having a smaller bandgap width than that of the electron accumulation layer.

(2) The hole absorption electrode is formed on the electron accumulation layer via a p-type semiconductor layer.

(3) The hole absorption electrode is formed of the same material as the gate electrode.

(4) The source electrode is formed between the hole absorption electrode and the gate electrode.

(5) The hole absorption electrode is formed in parallel with the gate electrode in a gate width direction and has substantially the same length as that of the source electrode in the gate width direction.

According to a third aspect of the present invention, there is provided a method of manufacturing a high electron mobility transistor, comprising a first step of laminating an electron accumulation layer and an electron supply layer successively on a substrate;

a second step of selectively removing the electron supply layer to isolate an element region;

a third step of forming a source and a drain electrode on the electron supply layer of the isolated element region; and a fourth step of forming a hole absorption electrode on the electron accumulation layer exposed by the selective removal of the electron supply layer, and simultaneously forming a gate electrode on the electron supply layer of the isolated element region.

According to the present invention, since the hole absorption electrode is formed on the electron accumulation layer in order to prevent holes generated by impact ionization from being accumulated on the electron accumulation layer, a kink phenomenon can be prevented. As a result, a good drain current/voltage characteristics can be obtained. It is therefore possible to obtain a high power/high electron mobility transistor having a good linearity and a high power-added efficiency.

DETAILED DESCRIPTION OF THE INVENTION

Now, embodiments of the present invention will be explained with reference to the accompanying drawings.

First Embodiment

Figure 4:
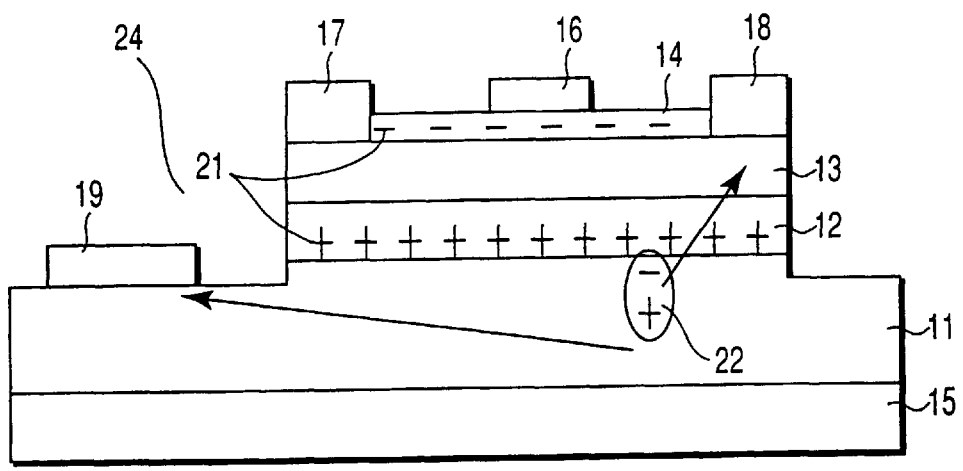
FIG. 4 is a schematic cross-sectional view of a high electron mobility transistor according to a first embodiment of the present invention.

FIG. 4 is a schematic cross-sectional view of a high electron mobility transistor (HEMT) according to a first embodiment of the present invention. Reference numerals 11, 12, 13, 14 and 15 denote a GaN electron accumulation layer, $Al_xGa_{(1-x)}N$ spacer layer, n-type $Al_xGa_{(1-x)}N$ electron supply layer, $Al_xGa_{(1-x)}N$ cap layer, and sapphire substrate, respectively. A gate electrode 16 is formed on the cap layer 14, while a source electrode 17 and a drain electrode 18 are formed on the electron supply layer 13. Furthermore, a hole absorption electrode 19 is formed for absorbing holes in a recess portion 24. The recess portion 24 is formed for isolation by removing a peripheral portion, other than an element region, of layers 12, 13 and 14 to reach the electron accumulation layer 11.

A manufacturing method of the HEMT of the first embodiment is described below. The undoped GaN electron accumulation layer 11 of 2 μm thick is grown on the (0001) sapphire substrate 15 by a metal organic chemical vapor deposition (MOCVD method). On the electron accumulation layer 11, an undoped $Al_{0.3}Ga_{0.7}N$ spacer layer 12 of 10 nm, and then, an n-type $Al_{0.3}Ga_{0.7}N$ electron supply layer 13 of 10 nm are formed successively by the same MOCVD method. The electron supply layer 13 contains Si as an impurity in a donor concentration of $4\times10^{18}$ cm$^{-3}$. On the electron supply layer 13, the undoped $Al_{0.3}Ga_{0.7}N$ cap layer 14 of 5 nm is formed. Next, a first etching for isolation is performed to form an element region in the form of a mesa, thereby exposing the electron accumulation layer 11 corresponding to the isolation region 24. Thereafter, a second etching is applied to the cap layer 14 to expose the portion of the electron supply layer 13 which is to be allowed into contact with an ohmic electrode to be formed later.

Subsequently, electrode layers 17 and 18 are formed as a source and a drain electrode (ohmic electrodes), by depositing and laminating Ti, Al, Ti and Au in this order from the bottom on the electron supply layer 13 exposed by the second etching, followed by subjecting to a heat treatment at 900° C. for 30 seconds. Next, as a Schottky gate electrode, the gate electrode 16 is formed on the cap layer 14 by depositing and laminating Pt, Ti and Au in this order from the bottom. Furthermore, in the electron accumulation layer 11 exposed in the previous process, in other words, in the bottom surface of the recess portion 24 formed for isolation, a hole absorption electrode 19 is formed by depositing and laminating Ni and Au, or Pt, Ti, Pt and Au in this order from the bottom. These materials are selected as electrode materials capable of ohmic contact for holes of the electron accumulation layer 11.

In the first embodiment, the hole absorption electrode 19 is formed to be in ohmic contact for holes of the GaN electron accumulation layer 11. However, as a large current is not expected to flow for absorbing holes, an electrode material to form a Schottky barrier with the undoped GaN electron accumulation layer 11 may be selected for the hole absorption electrode 19. When the Schottky junction electrode is used as the hole absorption electrode, the ohmic electrodes for source and drain electrodes may be formed at first, and, thereafter, the Schottky electrode is formed simultaneously with the gate electrode, by a deposition method.

Figure 1:
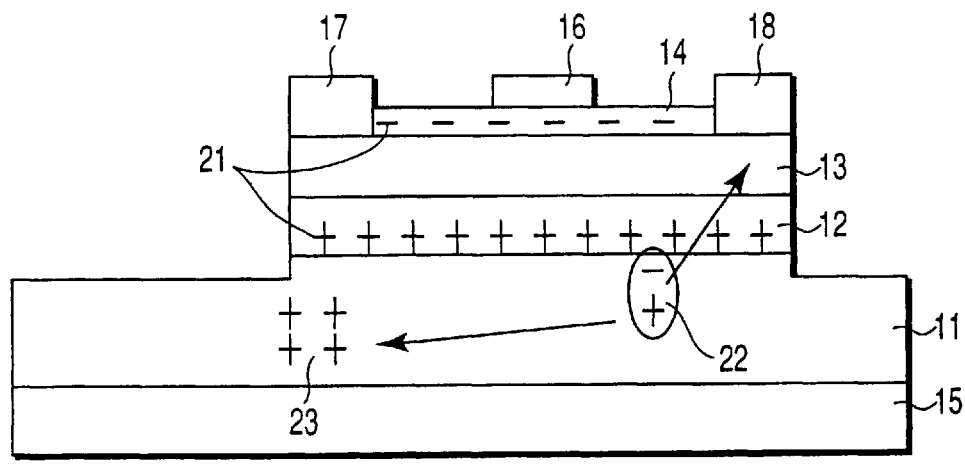
FIG. 1 is a schematic cross-sectional view of a GaN-based high electron mobility transistor according to a first conventional example.
Figure 2:
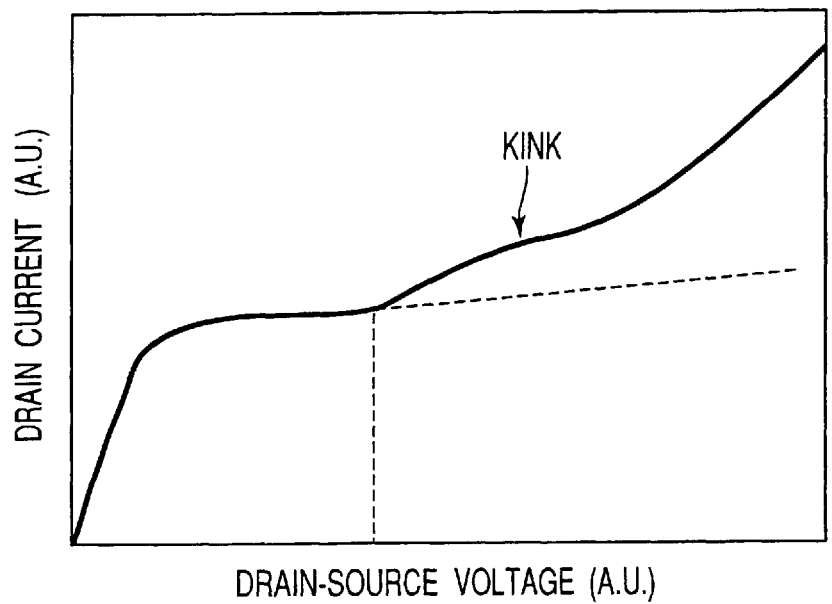
FIG. 2 is a graph showing typical drain-voltage/current characteristics of a high electron mobility transistor having a kink phenomenon caused therein.
Figure 3:
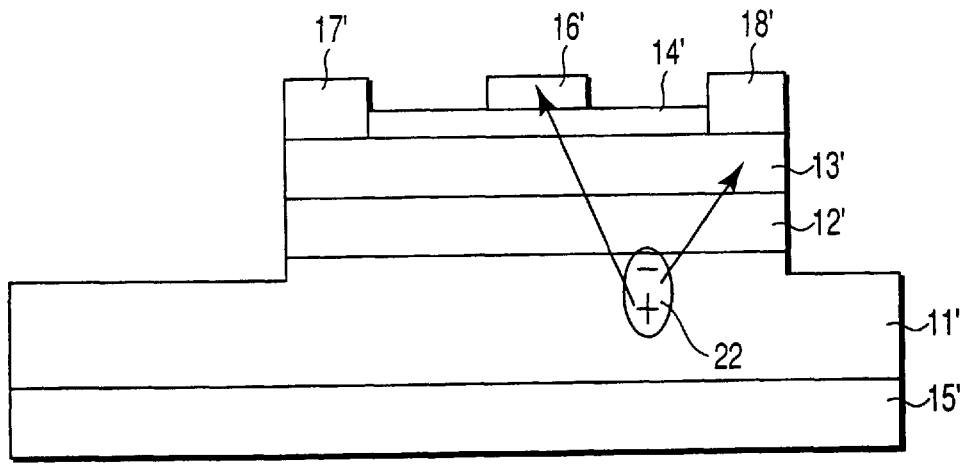
FIG. 3 is a schematic cross-sectional view of a GaAs-based high electron mobility transistor according to a second conventional example.

A field-effect transistor having a gate length of 1 µm was formed in the same construction manner as above. Thereafter, power characteristics were measured by setting the voltage of the hole absorption electrode 19 at the same potential as the source electrode 17 or lower, depending upon the operation point, in order to absorb the holes. As a result, the maximum value of the power-added efficiency increased by 5% compared to the conventional structure shown in FIG. 1. In addition, as the third-order intermodulation distortion was measured at the same output power, it decreased by 10 dBc than that of the conventional structure. Therefore, it was confirmed that the power characteristics show good linearity.

The reason why the power characteristics are improved is that the kink phenomenon shown in a drain current/voltage characteristics (explained in the first conventional example) is suppressed by the presence of the hole absorption electrode 19.

In the device structure according to the first embodiment, holes of pairs 22 of electrons and holes generated by impact ionization are quickly absorbed by the hole absorption electrode 19 and therefore not accumulated in the electron accumulation layer. Therefore, the potential of the electron accumulation layer can be stabilized, suppressing the kink phenomenon. As a result, it is possible to provide a high-performance device high in power-added efficiency and low in distortion.

The potential for the holes is lower at a side of the source electrode 17. Therefore, the holes generated by impact ionization are accumulated at the electron accumulation layer near the side of the source electrode 17. In this case, if the hole absorption electrode 19 is formed near the source electrode 17, as shown in FIG. 4, the holes can be efficiently absorbed.

In the first embodiment explained above, GaN is used as the electron accumulation layer 11 and AlGaN is used as the electron supply layer 13. However, the present invention can be effectively applied to any combination of semiconductor materials employed as the electron accumulation layer 11 and the electron supply layer 13, as long as a piezoelectric polarization charge 21 of $1 \times 10^{-7}$ C/cm$^2$ or more is generated by lattice mismatch near the hetero junction interface between both layers 11 and 13. Note that a piezoelectric polarization charge of about $4.6 \times 10^{-7}$ C/cm$^2$ is generated between $Al_{0.1}Ga_{0.9}N$ and GaN layers.

Second Embodiment

Figure 5:
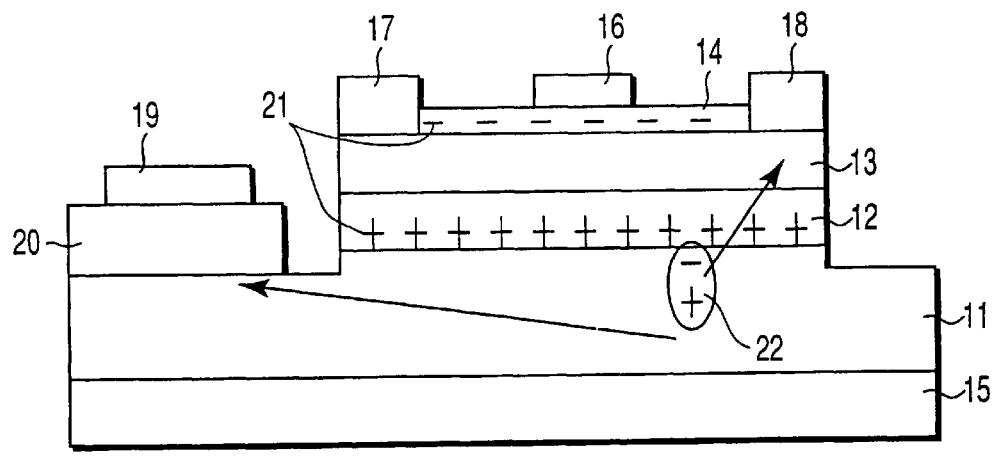
FIG. 5 is a schematic cross-sectional view of a high electron mobility transistor according to a second embodiment of the present invention.

FIG. 5 is a schematic cross-sectional view of a high electron mobility transistor according to a second embodiment of the present invention. The feature of the second embodiment resides in that a p-type semiconductor layer 20 (e.g., p-type GaN layer), or a semiconductor layer having a smaller bandgap width than that of the electron accumulation layer 11 is formed on the undoped GaN electron accumulation layer 11, and thereafter, a hole absorption electrode 19 is formed on the semiconductor layer 20. In this manner, it is possible to absorb holes more effectively than in the first embodiment. In FIG. 5, like reference numerals are used to designate like structural elements corresponding to those in FIG. 4 (the first example) and any further explanation is omitted for brevity's sake.

Third Embodiment

Figure 6:
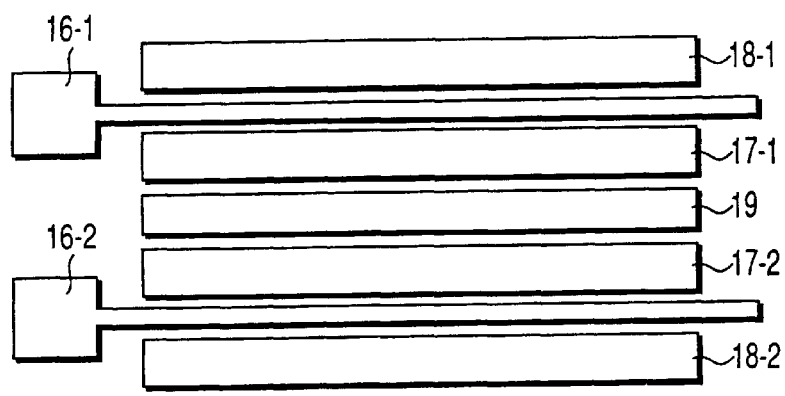
FIG. 6 is a schematic top view of a high electron mobility transistor according to a third embodiment of the present invention.

FIG. 6 is a schematic top view of a high electron mobility transistor according to a third embodiment of the present invention. The first HEMT electrodes are formed of a gate electrode 16-1, a source electrode 17-1, and a drain electrode 18-1. The second HEMT electrodes are formed of a gate electrode 16-2, a source electrode 17-2, and a drain electrode 18-2. The feature of the third embodiment resides in that the hole absorption electrode 19 is formed in parallel with the gate electrode 16-1 in the gate width direction and has substantially the same length as the source electrode 17-1 in the gate width direction. Since the length of the hole absorption electrode 19 is the same as that of the source electrode 17-1, the effect of the hole absorption can be made uniform at any cross section of the drain current direction within the FET, and the kink phenomenon is most effectively suppressed compared to the case where the hole absorption electrode is shorter than the source electrode. Furthermore, the holes from the two HEMTs can be absorbed by a single hole absorption electrode 19, so that the layout area of the elements can be effectively reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a high electron mobility transistor, comprising
    a first step of laminating an electron accumulation layer and an electron supply layer successively on a substrate;
    a second step of selectively removing the electron supply layer to isolate an element region;
    a third step of forming a source and a drain electrode on the electron supply layer of the isolated element region; and
    a fourth step of forming a hole absorption electrode on the electron accumulation layer exposed by the selective removal of the electron supply layer, and simultaneously forming a gate electrode on the electron supply layer of the isolated element region.

2. The method of manufacturing a high electron mobility transistor according to claim 1, wherein the fourth step includes a step of forming the hole absorption electrode on the electron accumulation layer via a semiconductor layer having a smaller bandgap width than that of the electron accumulation layer.

3. The method of manufacturing a high electron mobility transistor according to claim 1, wherein the fourth step includes a step of forming the hole absorption electrode on the electron accumulation layer via a p-type semiconductor layer.

4. The method of manufacturing a high electron mobility transistor according to claim 1, wherein the fourth step includes a step of forming the hole absorption electrode adjacent to the source electrode.

5. The method of forming a high electron mobility transistor according to claim 4, wherein the fourth step includes a step of forming the hole absorption electrode in parallel with the gate electrode in a gate width direction and having the substantially the same length as that of the source electrode in the gate width direction.

* * * * *